United States Patent [19]
DuRoss et al.

[11] Patent Number: 5,794,659
[45] Date of Patent: Aug. 18, 1998

[54] ZERO DEAD-LEG VALVE STRUCTURE

[75] Inventors: Ronald R. DuRoss, Huntsville, Ala.; William K. Tucker, Cherry Hill, N.J.

[73] Assignees: SCI Systems, Inc., Huntsville, Ala.; BOC Group Inc., New Providence, N.J.

[21] Appl. No.: 777,837

[22] Filed: Dec. 31, 1996

Related U.S. Application Data

[60] Continuation of Ser. No. 471,375, Jun. 6, 1995, abandoned, which is a division of Ser. No. 45,554, Apr. 9, 1993, abandoned.

[51] Int. Cl.⁶ .................................................. F16K 11/20
[52] U.S. Cl. ........................................... 137/597; 137/883
[58] Field of Search ............................... 137/597, 606, 137/607, 883, 595, 599

[56] References Cited

U.S. PATENT DOCUMENTS

| | | |
|---|---|---|
| 2,916,128 | 12/1959 | Oxley et al. . |
| 3,109,815 | 11/1963 | Lenardon et al. . |
| 3,459,221 | 8/1969 | Axelrod . |
| 3,461,913 | 8/1969 | Scott . |
| 3,540,477 | 11/1970 | Hogel . |
| 3,603,349 | 9/1971 | Botnick ............................ 137/607 X |
| 4,119,120 | 10/1978 | Mehaffy et al. . |
| 4,120,331 | 10/1978 | Krivanek, III . |
| 4,168,724 | 9/1979 | Graffunder et al. ............... 137/606 |
| 4,169,486 | 10/1979 | Otteman et al. . |
| 4,241,761 | 12/1980 | Miller . |
| 4,248,267 | 2/1981 | Brandenberg . |
| 4,383,547 | 5/1983 | Lorenz et al. . |
| 4,516,604 | 5/1985 | Taplin . |
| 4,554,942 | 11/1985 | Willams et al. . |
| 4,558,845 | 12/1985 | Hunkapiller ..................... 137/606 X |
| 4,597,412 | 7/1986 | Stark ................................ 137/606 |
| 4,703,913 | 11/1987 | Hunkapiller ..................... 137/606 X |
| 4,706,709 | 11/1987 | Monch ............................. 137/597 |
| 4,723,131 | 2/1988 | Droit . |
| 4,741,354 | 5/1988 | DeMild, Jr. . |
| 4,793,380 | 12/1988 | Lhota . |
| 4,867,201 | 9/1989 | Carten . |
| 4,869,301 | 9/1989 | Ohmi et al. . |
| 4,913,185 | 4/1990 | Mattei . |
| 4,917,136 | 4/1990 | Ohmi et al. . |
| 4,989,160 | 1/1991 | Garnett et al. . |
| 5,065,794 | 11/1991 | Cheung . |
| 5,137,047 | 8/1992 | George . |
| 5,139,225 | 8/1992 | Olson et al. . |
| 5,220,517 | 6/1993 | Sierk et al. . |
| 5,224,513 | 7/1993 | Bertone .......................... 137/597 |
| 5,273,075 | 12/1993 | Skaer ............................. 137/883 |
| 5,316,034 | 5/1994 | Farnsworth et al. ............ 137/606 X |

FOREIGN PATENT DOCUMENTS

| | | |
|---|---|---|
| 0 488 177 A1 | 11/1991 | European Pat. Off. . |
| WO-A-87 02598 | 5/1987 | WIPO . |

*Primary Examiner*—Stephen M. Hepperle
*Attorney, Agent, or Firm*—Curtis Morris & Safford P.C.; Gregor N. Neff

[57] ABSTRACT

A valve structure without dead-legs is provided for controlling the flow of gases in a semiconductor fabrication facility. The valve structure comprises a conduit forming a loop with three ports. Flexible metallic diaphragms are selectively operable to open and close two of the ports.

9 Claims, 5 Drawing Sheets

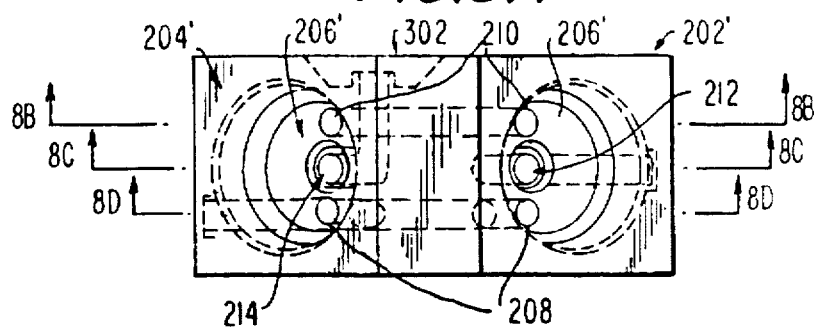
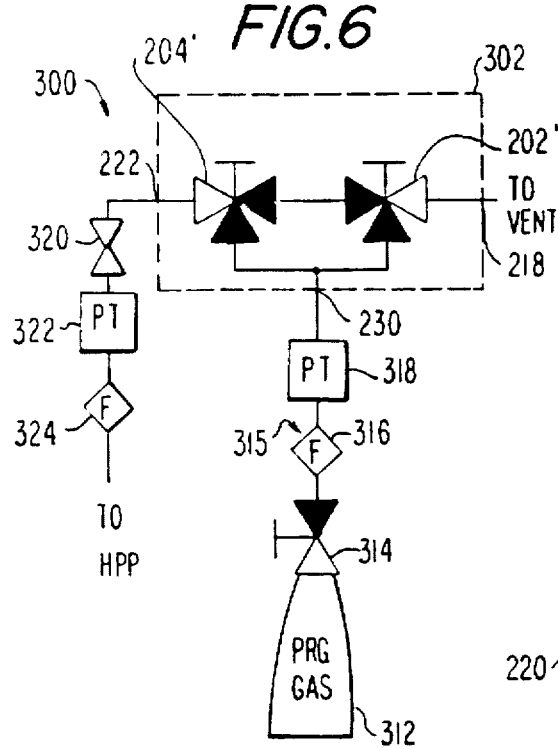
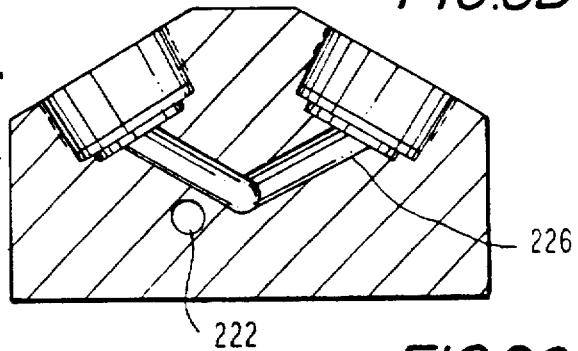
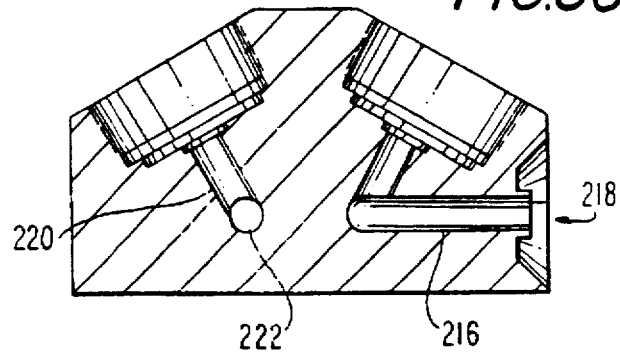
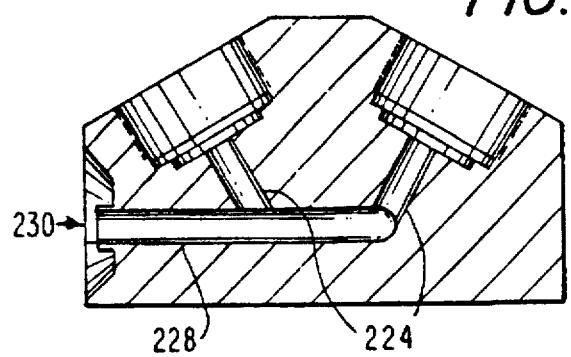

ZERO DEAD-LEG VALVE STRUCTURE

This application is a continuation of application Ser. No. 08/471,370, filed Jun. 6, 1995 which was a Divisional of Ser. No. 08/045,554 filed on Apr. 9, 1993 both abandoned.

This invention relates to gas distribution equipment and methods, and particularly to an apparatus and method for supplying process gas used in semiconductor manufacturing.

In the semiconductor manufacturing industry, gas cabinets are used to supply high purity process gases used in production. An example of such a process gas is silane, which is used at the processing location, also known as the tool location, in processes such as sputtering and sputter etching.

U.S. Pat. No. 4,989,160, and U.S. patent application Ser. No. 576,067 filed on Aug. 31, 1990, which are commonly assigned with the present application, disclose automated gas cabinets used for supplying process gas in semiconductor manufacturing operations. As noted in the patent and the application, many process gases used in semiconductor manufacturing are highly toxic, so that safe control of the gases is imperative. At the same time, the delicate nature of semiconductor manufacturing requires that the process gases be delivered to the tool location with an absolute minimum of contaminants. The disclosures of U.S. Pat. No. 4,989,160 and application Ser. No. 576,067 are incorporated herein by reference.

In order to permit process gas cylinder changes or other manual activities required in operation of a gas cabinet, purge operations like those disclosed in the above referenced patent are carried out in order to prevent exposure of the operator to the toxic process gas. Purge operations are also intended to flush contaminants out of the system of gas carrying conduits, known as a manifold, which is associated with the gas cabinet. As the field of semiconductor manufacture has advanced, the desired density of components in the resulting product has increased and the tolerance for contaminants has decreased. This has led designers of gas cabinet and their associated manifolds to seek to eliminate "dead-legs" in the manifolds, since dead-legs are considered to be sources of contaminants. As is known to those skilled in the art, a "dead-leg" is a section of conduit through which gas does not flow, i.e., the equivalent of a cul-de-sac or dead end road.

Attempts have been made in the past to provide a gas cabinet manifold that is free of dead-legs, but those attempts have not been entirely successful. To illustrate this point, reference will be made to FIGS. 1 and 2, which show prior art arrangements of gas cabinet manifolds.

In FIG. 1, reference numeral 10 generally indicates a gas cabinet manifold in accordance with the prior art. The manifold 10 includes a process gas cylinder 12 with an associated cylinder valve 14, a high pressure isolation (HPI) valve 16, a high pressure purge (HPP) valve 18 and a high pressure vent (HPV) valve 20. Manifold 10 also includes a pressure regulator 22, a low pressure isolation (LPI) valve 24 and a low pressure vent (LPV) valve 26.

The manifold 10 further includes a junction point 28 which is connected to the cylinder valve 14 by a conduit section 30. Conduit sections 32, 34 and 36 respectively connect the junction point 28 with HPI valve 16, HPP valve 18, and HPV valve 20. When manifold 10 is being operated to supply process gas to a tool location, the process gas flows from cylinder 12 through valve 14, conduit section 30, junction point 28, conduit section 32, HPI valve 16, pressure regulator 22 and LPI valve 24 on its way to the tool location (not shown). It will be noted that during such an operation, process gas does not flow through conduit sections 34 and 36, so that those sections constitute dead-legs during process gas supply operations. Moreover, during a purge-to-change-process-gas-cylinder operation, HPI valve 16 is closed and HPV valve 20 and HPP valve 18 are alternately opened and closed to place conduit section 30 alternately in communication with a vacuum venturi and with a source of purge gas. However, during such purge operations conduit section 32 does not have gas flowing therethrough, and so constitutes a dead-leg during purge operations.

Referring now to FIG. 2, reference numeral 10' indicates another prior art manifold provided in an attempt to eliminate dead-legs during delivery of process gas. Elements of manifold 10' which correspond to elements of FIG. 1 have been given the same reference numerals. In the manifold 10' shown in FIG. 2, it will be noted that HPP valve 18', HPV valve 20' and LPV valve 26' are all shown as "3-port" valves which have a selectively closable port and two other ports which are always in fluid communication with each other, regardless of whether the closable port is open or closed. Accordingly, during delivery of process gas, the gas flows from cylinder 12 via cylinder valve 14, HPP valve 18', HPV valve 20', HPI valve 16, pressure regulator 22, LPV valve 26' and LPI valve 24 on its way to the tool location. This flow path has no dead-legs associated with it, so that during process gas delivery operations, manifold 10' is dead-leg free. However, during purge operations, in which HPI valve 16 is closed and HPP valve 18' and HPV valve 20' are alternately opened and closed, a conduit section 38 between HPI valve 16 and HPV valve 20' experiences no flow of gas therethrough, and so constitutes a dead-leg during purge operations. As a result, contaminants may remain in conduit section 38 on the completion of a purge operation, leading to the possibility of contamination of the semiconductors subsequently manufactured at the tool location. Therefore, the dead legs also have not been eliminated from the FIG. 2 system.

Accordingly, it is an object of the invention to provide a process gas distribution system and method in which the level of contaminants in the gas is minimized. To this end, it is an object to provide a gas distribution manifold that is substantially free of dead-legs during both purge and process gas delivery operations.

It is also an object of the invention to provide a valve assembly for use in a process gas distribution manifold in which dead-legs are to be substantially eliminated.

Another object of the invention is to provide the foregoing at a reasonable cost.

A further object of the invention is to provide a method for venting high pressure process gas from a gas cabinet manifold with a high degree of safety for operating personnel.

In accordance with the present invention, the foregoing objects are met by the provision of a valve assembly which includes two valves for selectively controlling flow of a fluid, with each of the valves including a valve chamber in which are formed first and second inlet ports and an outlet port and a closing mechanism disposed within the valve chamber for selectively closing the outlet port, with the valve assembly also including a first conduit connecting the respective first inlet ports of the two valves, a second conduit connecting the respective second inlet ports of the two valves, and structure for introducing the fluid into the first conduit. Such a valve assembly facilitates construction of a gas cabinet manifold without dead-legs.

In accordance with another feature of the invention, a pair of valves is provided in a manifold for supplying process gas to a tool location, with the manifold including a pressure regulator connected between a high pressure area and a regulated pressure area, and each of the valves including first and second inlet ports and a selectively closable outlet port, the outlet port of one of the valves being connected for fluid communication with a high pressure side of the pressure regulator, the outlet port of the other of the valves being selectively connectable for fluid communication with at least one of a source of purge gas and a source of vacuum, the first inlet ports of the valves being connected in common for fluid communication with a source of process gas, and the second inlet ports of the valves being interconnected for fluid communication therebetween. With this arrangement of valves within a manifold, gases are free to flow through the valve chambers of each of the valves even when the valves are closed, so that neither valve becomes a dead end which forms a dead-leg in the manifold.

According to a further feature of the invention, the manifold also includes a second and a third pair of valves with each of the valves of the second and third pairs including first and second inlet ports and a selectively closable outlet port; the outlet port of one of the second pair of valves being connected for fluid communication with the source of vacuum, the outlet port of the other of the second pair of valves being connected to a source of purge gas, the first inlet ports of the second pair of valves being connected in common for fluid communication with the outlet port of the other of the first pair of valves, the second inlet ports of the second pair of valves being interconnected for fluid communication therebetween, the outlet port of one of the third pair of valves being connected for fluid communication with the tool location, the outlet port of the other of the third pair of valves being connected for fluid communication with the source of vacuum, the first inlet ports of the third pair of valves being connected in common for fluid communication with the pressure regulator, and the second inlet ports of the third pair of valves being interconnected for fluid communication therebetween. In this way, all of the valves required for a dead-leg-free gas cabinet manifold are provided in the form of three valve assemblies, with all of the valves permitting flow-through of gas so that dead-legs are avoided.

According to yet another feature of the invention, a pair of valves is provided in a manifold for supplying process gas to a tool location, with the manifold including a regulated pressure area and the valves each including first and second inlet ports and a selectively closable outlet port, the outlet port of one of the valves being connected for fluid communication with the tool location, the outlet port of the other of the valves being connected for fluid communication with a source of vacuum, the first inlet ports of the valves being connected in common for fluid communication with the regulated pressure area, and the second inlet ports of the valves being interconnected for fluid communication therebetween. As before, each of the valves permits flow-through of gases even when the valves are closed, so that dead-legs are avoided.

According to still another feature of the invention, a pair of valves is provided in a manifold for supplying process gas to a tool location, with the manifold including a high pressure area and the valves each including first and second inlet ports and a selectively closable outlet port, the outlet ports of one of the valves being connected for fluid communication with a source of vacuum, the outlet port of the other of the valves being connected for fluid communication with a source of purge gas, the first inlet ports of the valves being connected in common and being selectively connectable for fluid communication with the high pressure area, and the second inlet ports of the valves being interconnected for fluid communication therebetween. Again, the valves permit flow-through of gas even when closed, so that dead-legs are avoided.

According to another feature of the invention, in a gas cabinet manifold which includes a pressure regulator connected between a high pressure area and a regulated pressure area, a process gas supply line connected to the high pressure area and a valve located in the high pressure area for selectively isolating the pressure regulator from the process gas conduit, a method of purging the process gas supply line includes the steps of closing the valve and flowing a purge gas through a valve chamber of the closed valve to the process gas conduit. In this way, a process gas supply line purge operation is performed without dead-legs in the gas cabinet manifold.

According to another feature of the invention, in a gas cabinet manifold which includes a high pressure area, a regulated pressure area and a pressure regulator connected between the high pressure area and the regulated pressure area, a method of purging the manifold includes the step of venting process gas from the high pressure area by way of the pressure regulator and the regulated pressure area. As a result, purging of process gas from the high pressure area is made safer since high pressure process gas is not directly vented into the atmosphere.

According to another aspect of this method, the gas cabinet manifold has a vent valve for selectively connecting the regulated pressure area to a source of vacuum and an isolation valve for selectively connecting the regulated area to a tool location and the method includes the additional steps of closing the isolation valve and opening the vent valve, with the step of venting process gas including flowing the process gas through a valve chamber of the closed isolation valve to the source of vacuum. In this way, a dead-leg terminating at the low pressure isolation valve is eliminated.

According to another feature of the invention, in a gas cabinet manifold which includes a conduit for providing process gas to a tool location, an isolation valve for selectively connecting the conduit to the tool location and a vent valve for selectively connecting the conduit to a source of vacuum, a method of purging the conduit includes the steps of closing the isolation valve, opening the vent valve, and flowing gas from the conduit to the source of vacuum via a valve chamber of the closed isolation valve. As before, such a method eliminates a dead-leg terminating at the isolation valve.

In accordance with yet another aspect of the invention, a pair of valves is provided in a purge gas manifold for use in association with a gas cabinet manifold, and each of the valves includes first and second inlet ports and a selectively closable outlet port, the outlet port of one of the valves being connected for fluid communication with the gas cabinet manifold, the outlet port of the other valve being connected for fluid communication with an exhaust vent, the first inlet ports of the valves being connected in common for fluid communication with a source of purge gas, and the second inlet ports being interconnected for fluid communication therebetween. This arrangement eliminates dead-legs in the purge gas manifold.

It is not intended that the invention be summarized here in its entirety. Rather, further features, aspects and advantages of the invention will be set forth in or apparent from the following description and drawings. In the drawings:

FIG. 6 is a schematic illustration of a purge gas manifold used in association with the gas cabinet manifold of FIG. 3;

FIGS. 8A–8D are additional views of the valve assembly of FIG. 7.

OVERVIEW OF GAS CABINET MANIFOLD

Figure 1:
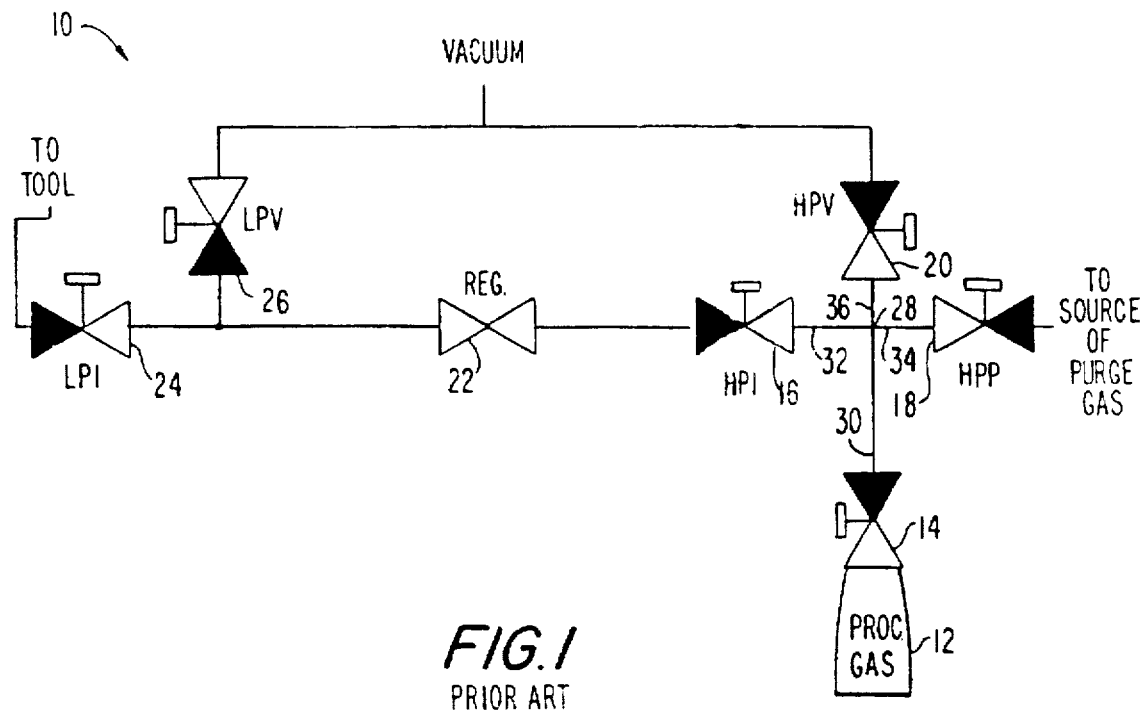
FIGS. 1 and 2 are schematic illustrations of gas cabinet manifolds in accordance with the prior art.
Figure 2:
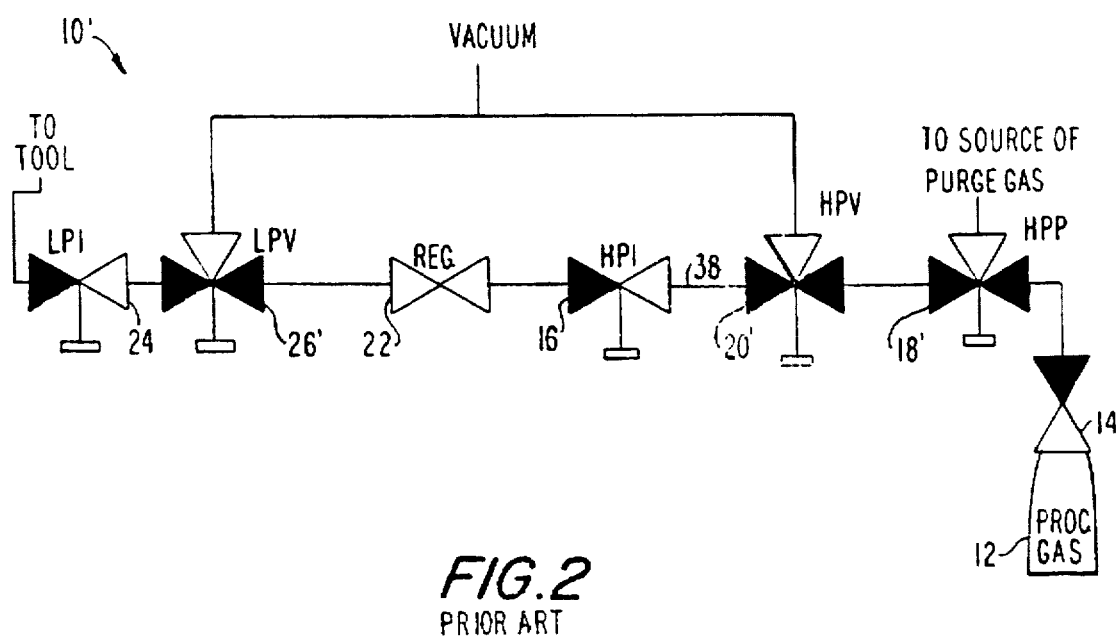
Figure 3:
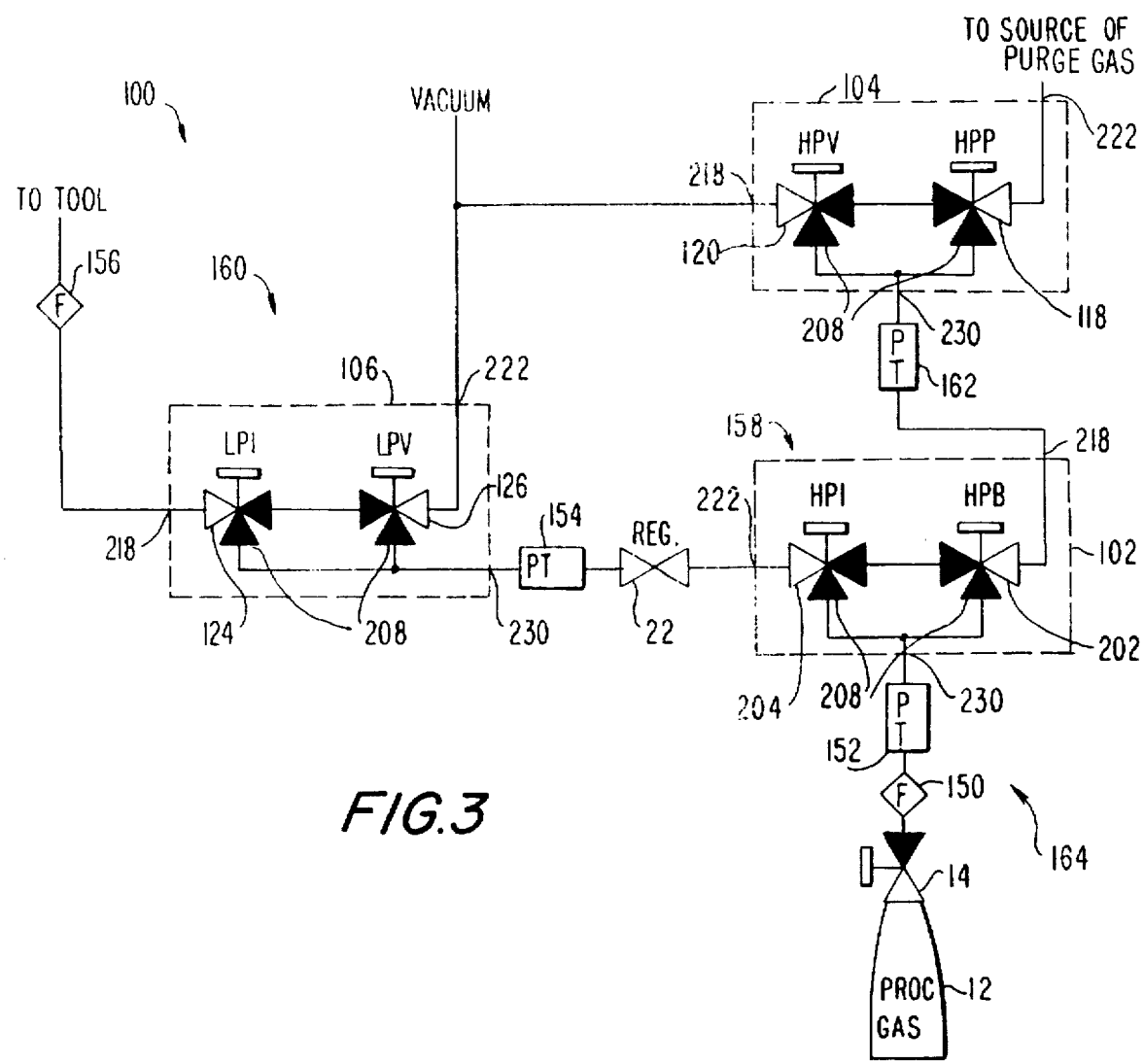
FIG. 3 is a schematic illustration of a gas cabinet manifold according to the present invention.

FIG. 3 schematically illustrates a gas cabinet manifold 100 according to the present invention. Elements of manifold 100 that correspond to elements of prior art manifold 10 have been given the same reference numerals.

Manifold 100 includes three dual valve assembly blocks 102, 104 and 106. Although the overall arrangement of manifold 100 differs from the arrangements of prior art manifolds, except for the valve assembly blocks 102, 104 and 106, all of the components of manifold 100 are preferably of conventional types and so will not be described in detail.

Except for a cylinder valve 14, all of the valves required for manifold 100 are included in the valve blocks 102, 104 and 106. Valve blocks 102, 104 and 106 are preferably identical, so that the following description of valve block 102 should be understood to apply also to valve blocks 104 and 106.

DESCRIPTION OF REPRESENTATIVE DUAL VALVE ASSEMBLY

Figure 4A:
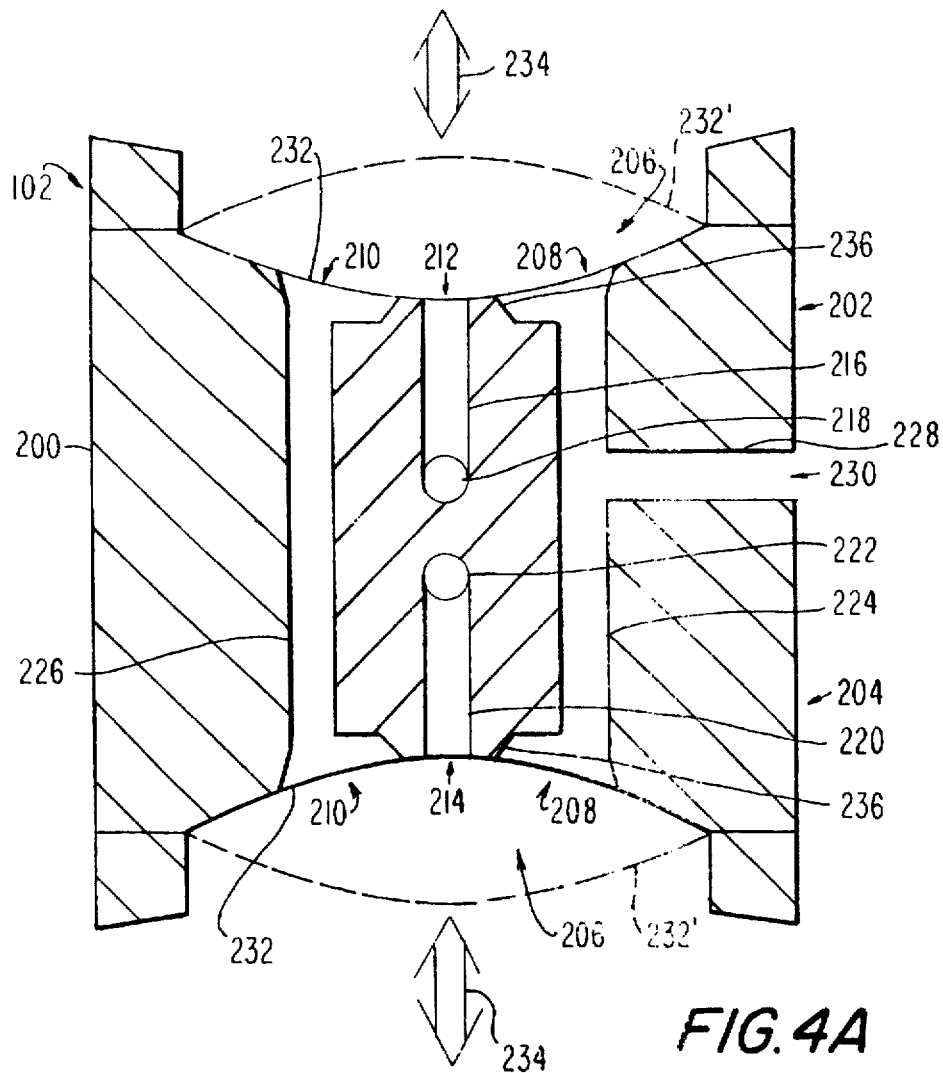
FIGS. 4A–4C are partially schematic cross-sectional views of a dual valve assembly used in the manifold of FIG. 3.

Referring now to FIG. 4A, valve block 102 includes a substantial valve block body 200 in which valves 202 and 204 are formed. Each of the valves 202 and 204 has a valve chamber 206. Each of the valve chambers 206 has a first port 208 and a second port 210. The valve chamber 206 of valve 202 has an port 212 while the valve chamber 206 of valve 204 has an port 214. A conduit 216 connects port 212 of valve 202 to a first port 218 of valve block 102. A conduit 220 connects port 214 to a second port 222 of valve block 102. A conduit 224 interconnects the respective first ports 208 of valves 202 and 204, and a conduit 226 interconnects the respective second ports 210 of the valves 202 and 204. In addition, conduit 224 is connected via a conduit 228 to a third port 230 of valve block 102. Each of the conduits 216, 220, 224, 226 and 228, like valve chambers 206 and ports 208, 210 and ports 212 and 214, is formed in valve block body 200, by machining, for example.

Disposed within each of the valve chambers 206 is a diaphragm 232 which is provided for selectively opening or closing outlet port 212 or 214, as the case may be. In FIG. 4A each of the diaphragms 232 is shown in its closed position with its open position being represented by a dashed curve 232'. The two-headed arrows 234 represent conventional mechanisms, preferably pneumatic, for controlling the position of diaphragms 232. The mechanisms 234 are used for moving the diaphragm 232 between their open and closed positions.

Figure 5:
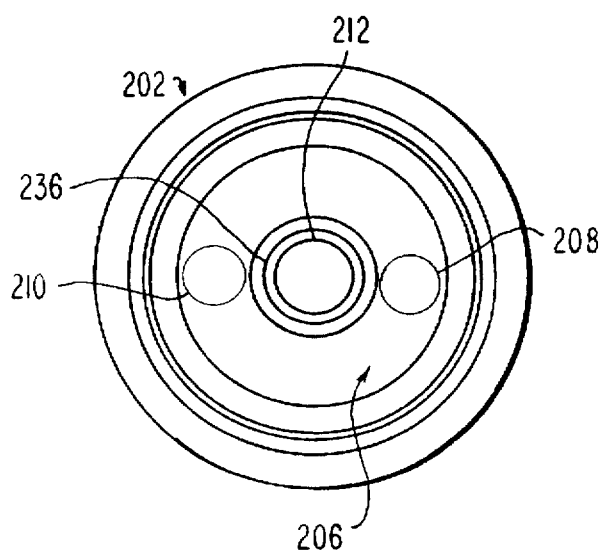
FIG. 5 is a view looking into the valve chamber of a valve included in the valve assembly of FIGS. 4A–4C.

As best seen in FIG. 5, the port 212 of valve 202, like the port 214 of valve 204, is located within a valve seat 236. Diaphragms 232 and valve seat 236 are fitted and dimensioned so that a seal is formed therebetween when diaphragm 232 is in its closed position. Diaphragms 232 are made of a conventional material such as a nickel alloy known as "Elgiloy"® (produced by Elgiloy Corp.), while the seat 236 is also formed of a conventional material such as the elastomers known as "KEL-F-81"® (from 3M) or "Vespel"® (from Dupont). It should be understood that the valve block body 200 is also of a conventional material such as 316L VAR or 316L VIM VAR stainless steel, or nickel, or an alloy known as "Hastalloy C22"® (from Haynes Corp.).

Alternatively valve seat 236, instead of being formed of elastomer, may be integrally formed in valve block body 200. Also, the diaphragms 232 may be of one of the materials from which block body 200 may be formed.

Valve chamber 206 is formed such that even when a diaphragm 232 is in its closed position so that the corresponding port 212 or 214 is closed, nevertheless the corresponding ports 208 and 210 are still in fluid communication with each other through valve chamber 206 around the base of valve seat 236. Accordingly, regardless of the open or closed state of valves 202 or 204, valve block 102 has a constantly open loop of flow path formed by the conduits 226 and 224, which are connected through the valve chambers 206 and the ports 208 and 210.

It should also be noted that the valves 202 and 204 are arranged in valve block 102 in a mutually opposed orientation. This arrangement allows valve block 102 to be relatively small in size and permits an overall space efficient design for gas cabinet manifold 100. Provision of two valves in a single assembly also minimizes the cost of installing valves in the manifold 100.

DETAILED DESCRIPTION OF GAS CABINET MANIFOLD

Gas cabinet manifold 100 will now be described in more detail. Referring again to FIG. 3, it will be seen that process gas cylinder 12 is connected to the port 230 of valve block 102 by way of cylinder valve 14, a filter 150, and a pressure transducer 152. The two valves 202 and 204 of valve block 102 function respectively as a high pressure block (HPB) valve and a high pressure isolation (EPI) valve.

The port 222 of valve block 102 is connected to pressure regulator 22. As is well known to those skilled in the art, pressure regulator 22 serves to reduce the pressure of gas flowing from the process gas cylinder 12 toward the tool location. Pressure regulator 22 is connected by way of a pressure transducer 154 to a port 230 of valve block 106. The two valves of valve block 106 respectively function as a low pressure isolation (LPI) valve and a low pressure vent (LPV) valve and are given the respective reference numerals 124 and 126. The selectively closable outlet port (corresponding to outlet port 212, FIG. 4A) of LPI valve 124 is connected to a tool location (not shown) via a port 218 of valve block 106 and a filter 156. The selectively closable outlet port of LPV valve 126 (corresponding to outlet port 214, FIG. 4A) is connected via a port 222 of valve block 106 to a conventional source of vacuum such as a venturi (not shown), which, as is well known to those skilled in the art, is provided for applying a vacuum to selected portions of manifold 100 during purge operations. Because of the reduction in pressure provided by pressure regulator 22, the portion of manifold 100 shown to the right of pressure regulator 22 in FIG. 3 and between HPB valve 202 and process gas cylinder 12 can be considered a high pressure area 158 of manifold 100. It can also be said that the outlet port 212 of HPI valve 204 is connected to the high pressure side of regulator 22. Moreover, the area shown to the left of regulator 22 in FIG. 3 and between LPI valve 124 and LPV valve 126 can be considered a regulated pressure area 160 of manifold 100 and the first ports 208 of LPI valve 124 and LPV valve 126 can be said to be connected (via port 230 of valve block 106) to the regulated pressure side of regulator 22.

The port 218 of valve block 102 is connected by way of a pressure transducer 162 to a port 230 of valve block 104. The two valves of valve block 104 respectively perform the functions of a high pressure vent (HPV) valve and a high pressure purge (HPP) valve and are given the respective reference numerals 120 and 118. The outlet port of HPP valve 118 is connected via port 222 of valve block 104 to a source of purge gas (not shown in FIG. 3), and the outlet port of HPV valve 120 is connected to the venturi via port 218 of valve block 104.

From the foregoing it will be understood that the function of HPV valve 120 is to selectively apply vacuum to the high pressure area 158, the function of HPP valve 118 is to selectively apply purge gas to high pressure area 158, the function of HPB valve 202 is to selectively isolate the high pressure area 158 from valve block 104, the function of HPI valve 204 is to selectively isolate the process gas supply, including process gas cylinder 12, from pressure regulator 22 (and hence also from regulated pressure area 160 and from the tool location), the function of LPV valve 126 is to selectively apply vacuum to the regulated pressure area 160, and the function of LPI valve 124 is to selectively isolate regulated pressure area 160 (and hence substantially all of manifold 160) from the tool location.

Pressure transducers 152, 154 and 162 and filters 150 and 156 are all preferably conventional components for a gas cabinet manifold. The pressure transducers are preferably of the type formed of strain gages attached to the outside of conduits so that no dead-legs or other sources of contamination or restrictions to gas flow are present. Preferably filter 150 is a gasket type for coarse filtration and filter 156 is for fine filtration.

OPERATION OF THE GAS CABINET

Figure 4B:
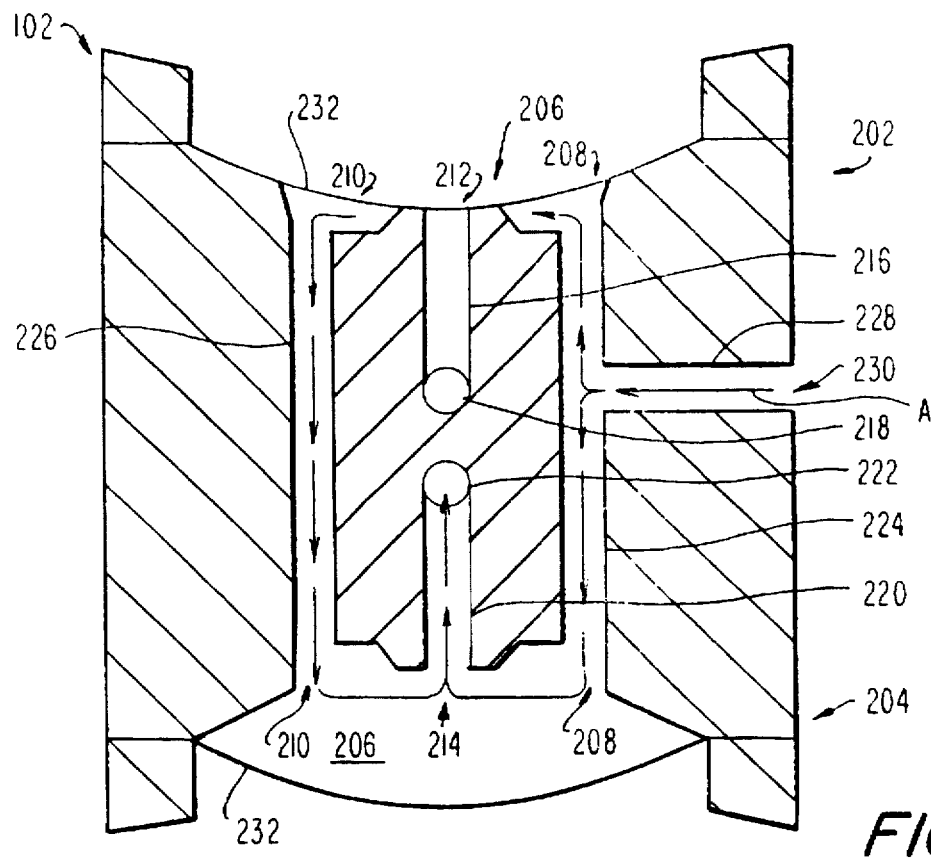

Operation of gas cabinet manifold 100 for delivery of process gas to the tool location will be described with reference to FIGS. 3 and 4B. When process gas is being delivered to the tool location, valves 202 (HPB), 120 (HPV), 118 (HPP), and 126 (LPV) are all closed, while the cylinder valve 14 and valves 204 (HPI) and 124 (LPI) are open. According, process gas flows from process gas cylinder 12 through cylinder valve 14, filter 150, pressure transducer 152, valve chambers 206 of HPB valve 202 and HPI valve 204, port 214 of HPI valve 204, port 222 of valve block 102, pressure regulator 22, pressure transducer 154, port 230 of valve block 106, valve chambers 206 of LPV valve 126 and LPI valve 124, the outlet port of LPI valve 124, port 218 of valve block 106, and filter 156 on its way to the tool location. It will be observed that there are no dead-legs in or along the flow path of the process gas.

Flow of process gas through valve block 102 will now be described in more detail with reference to FIG. 4B.

It will be noted that during process gas delivery operations, the diaphragm 232 of valve 204 is in its open position and the diaphragm 232 of valve 202 is in its closed position. The process gas flow is represented by the arrows A in FIG. 4B, which show the process gas entering conduit 228, through port 230 and then traveling by two paths on its way to outlet port 214 of valve 204. In particular, the first and more direct path is from conduit 228 downward (as shown in FIG. 4B) through conduit 224, entering valve chamber 206 of valve 204 through the port 208 of valve 204 and then exiting through port 214 of valve 204. The second and less direct path is shown as proceeding from conduit 228 in an upward direction (as shown in FIG. 4B) through conduit 224 so that the process gas enters the lower portion of valve chamber 206 of valve 202 (i.e. the portion below diaphragm 232 of valve 202) via port 208 of valve 202. The second flow path continues through valve chamber 206 of valve 202 from its port 208 to its port 210 and then downwardly as shown in FIG. 4B through conduit 226 so that the second flow path enters the valve chamber 206 of valve 204 through the port 210 of valve 204. The two flow paths join together in exiting valve 204 via its outlet port 214 and continue on through conduit 220 to port 222. Due to the loop formed by valve chambers 206, ports 208 and 210, and conduits 226 and 224, there are no dead-legs within valve block 102.

The flow of process gas through valve block 106 is essentially the same as in valve block 102, with LPI valve 124 being open and corresponding to HPI valve 204, and LPV valve 126 being closed and corresponding to HPB valve 202. Accordingly, valve block 106 is also free of dead-legs during process gas delivery.

CHANGING THE PROCESS GAS CYLINDER

There will next be described operation of the gas cabinet manifold 100 for the purpose of changing the process gas cylinder 12, as is required, for example, when the process gas stored in cylinder 12 has been exhausted. The procedure for changing cylinder 12 can be divided into four stages: (1) pre-purge, during which the toxic process gas is removed from high pressure area 158 to ensure that the operator is not exposed to process gas; (2) cylinder change; (3) post-purge, for removing from manifold 100 contaminants that may have been introduced during the cylinder change; and (4) refill, for refilling the manifold 100 with pure process gas.

1. Pre-Purge

The pre-purge stage is divided into two portions: a valve test and the purging itself.

The first steps of the valve test include closing cylinder valve 14 and LPI valve 124. The venturi is then activated so that a vacuum will be applied to any points of the manifold 100 which are placed in fluid communication with the venturi. Next, HPV valve 120 is opened and pressure transducer 162 is monitored to confirm that a sufficiently low vacuum is present at pressure transducer 162. The next step consists of closing HPV valve 120 and opening LPV valve 126 so that the vacuum is applied to high pressure area 158 through pressure regulator 22. This ensures that high pressure process gas is not released directly into the atmosphere. Instead, the process gas is vented from the high pressure area 158 through pressure regulator 22 and regulated pressure area 160. It will be understood that the process gas flows through the valve chambers of both closed LPI valve 124 and open LPV valve 126 before exiting from valve block 106 through its port 222.

The following step is closing LPV valve 126 and HPI valve 204 and then opening HPV valve 120 and HPB valve 202. This causes vacuum to be applied through HPV valve 120 and HPB valve 202 to the conduit 164 which connects process gas cylinder 12 to manifold 100 (this conduit 164 will sometimes be referred to as the "pigtail"). After evacuation of the pigtail 164, the HPV valve 120 and HPB valve 202 are closed and pressure transducer 152 is monitored for a predetermined period of time to ensure that cylinder valve 14, believed to be closed, is not leaking. If no leak is found, then the valve test portion of the pre-change purge operation is complete and the pre-purging itself begins.

The pre-purging commences with the opening of HPB valve 202. This valve is left open throughout the pre-purging cycles. Next, the HPP valve 118 is opened to admit purge gas at approximately 100 psi into the high pressure area 158 and pigtail 164. More specifically, the purge gas enters valve block 104 through its port 222 and flows through the valve chambers 206 of both valves 120 (HPV) and 118 (HPP) and flows out of valve block 104 through its port 230. The purge gas continues through pressure transducer 162 and enters valve block 102 through its port 218. The gas flows through the valve chambers 206 of both of valves 202 (HPB) and 204 (HPI), and enters pigtail 164 through port 230 of valve block 102.

Figure 4C:
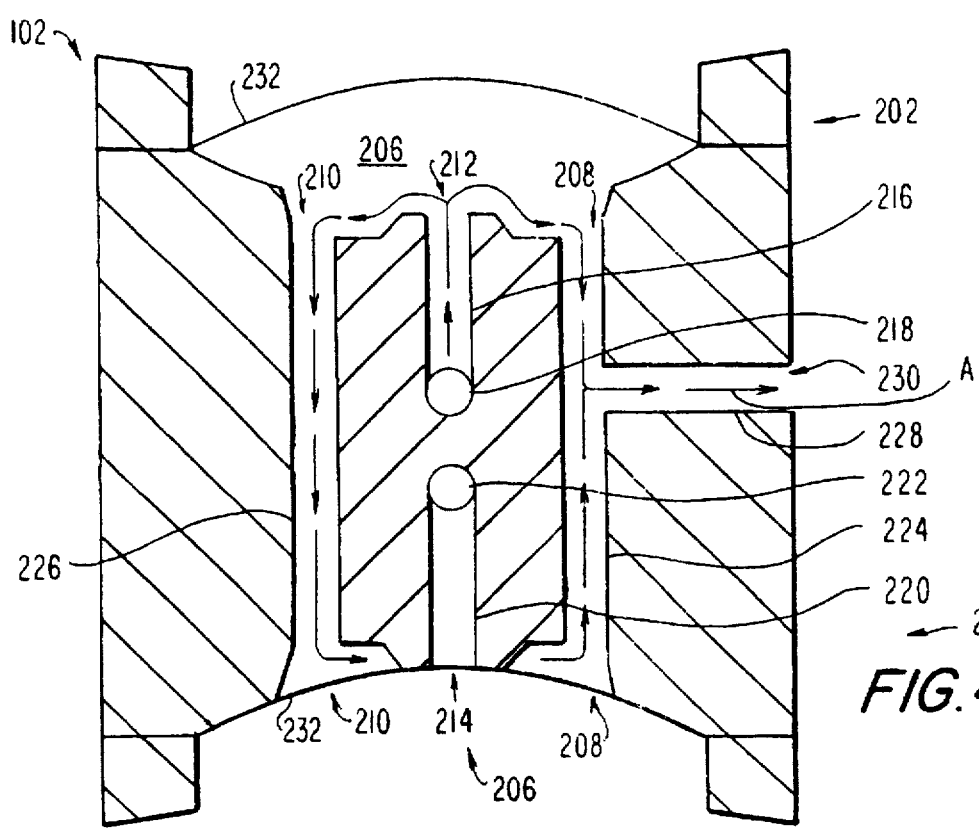

The flow of purge gas through valve block 102 will be described in more detail with reference to FIG. 4C. During the purging, valve 202 is open (i.e., its diaphragm 232 is in the open position) and valve 204 is closed. As before, the flow path is represented by arrows A. As noted above, the purge gas enters valve block 102 through port 218. The purge gas then proceeds via conduit 216 to valve chamber 206 of valve 202. The gas flow then divides among two paths. One path proceeds from the valve chamber 206 of valve 202 via port 210 and conduit 226 to valve chamber 206 of valve 204. The purge gas flows around the closed diaphragm 232 of valve 204 on its way to inlet port 208 of valve 204, from where the gas flows (upwardly as shown in FIG. 4C) in conduit 224 to conduit 228 and out through port 230. Another and more direct gas flow path proceeds from valve chamber 206 of valve 202 downwardly (as shown in FIG. 4C) in conduit 224 and then to conduit 228 and out of port 230.

After the purge gas has been applied for a predetermined period of time, HPP valve 118 is closed, and HPV valve 120 is opened to apply vacuum to high pressure area 158 and pigtail 164. The flow paths of gas through valve block 102 during evacuation of high pressure area 158 and pigtail 164 are in reverse directions to the flow paths shown in FIG. 4C. At the end of a predetermined period of time, HPV valve 120 is closed and HPP valve 118 is opened again for reapplication of purge gas at high pressure (100 psi, for example). As will be appreciated by those skilled in the art, the applications of high pressure purge gas and vacuum are alternately applied for a predetermined number of cycles.

From the above description of the flow paths in valve block 102, it will be understood that there are no dead-legs in valve block 102 during either the purge or evacuation phases of the purge cycle. The same can be said of valve block 104, since the flow paths therein during application of purge gas correspond exactly to the flow paths in valve block 102, with HPV valve 120 corresponding to HPI valve 204 and HPP valve 118 corresponding to HPB valve 202. During evacuation, the gas is drawn out through HPV valve 120, with HPP valve 118 closed, so that during this cycle, HPV valve 120 should be thought of as corresponding to HPB valve 202 and HPP valve 118 as corresponding to HPI valve 204. In both cases, however, valve block 104 is free of dead-legs. Also, as will be seen, a flow-through of purge gas will be applied to pigtail 164 in the next stage of the procedure so that pigtail 164 will not constitute a purge dead-leg.

2. Cylinder change

Upon completion of the pre-purge cycles, purge gas is applied at low pressure through HPP valve 118 and HPB valve 202 (as well as the valve chambers 206 of closed HPV valve 120 and closed HPI valve 204). Then the cylinder 12 is disconnected, allowing the pigtail 164 to be flushed by the low pressure purge gas. It will be appreciated that this eliminates pigtail 164 as a dead-leg. After a predetermined period of time for flushing pigtail 164, a new process gas cylinder 12 is connected to the pigtail 164.

3. Post-Purge

The cylinder change process then continues with a post-purge of the operation, which is divided into two portions: a connection test and the post-purging itself.

As a first step in the connection test, high pressure (100 psi) purge gas is applied through HPP valve 118 and HPB valve 202 to the pigtail 164. The HPB valve is then closed and pressure transducer 152 is monitored to determine whether a pressure drop is experienced in pigtail 164. If so, it is an indication that the new process gas cylinder 12 has not been properly connected. As a backup check, it is also preferable to use a helium sensor (not shown) to determine whether the purge gas, which is preferably a mixture of $N_2$ and He, is present in the vicinity of pigtail 164. Assuming that both of the checks find no leak, then HPP valve 118 is closed, and HPV valve 120 and HPB valve 202 are opened to evacuate the pigtail 164. Then HPB valve 202 is closed and pressure transducer 152 again is monitored to determine whether a vacuum is retained in the pigtail 164. Again, if not, it is an indication that the process gas cylinder 12 was not properly connected.

Assuming that no problem is detected in any of the connection tests, then the post purging of the high pressure area begins. Accordingly, HPB valve 202 is opened and remains open throughout the post-purging cycles. The post-purging cycles take the same form as the pre-purging cycles, described above, with alternate applications of purge gas through HPP valve 118 and applications of vacuum through HPV valve 120. After a predetermined number of cycles, and ending with an evacuation operation, the post-purging is complete and HPB valve 202 is closed.

4. Refill

The final stage of the cylinder change operation is refilling of the manifold 100 with process gas. This begins with opening of cylinder valve 14. Next, HPI valve 204 is opened so that process gas flows from the cylinder 12 through both valve chambers 206 of valve block 102 and out through port 222 of valve block 102, and then through pressure regulator 22 into the regulated pressure area 160 of manifold 100. Next, the cylinder valve 14 is closed and LPV valve 126 is opened so that a vacuum is applied to manifold 100 through its low pressure area 160. For a predetermined number of cycles, application of process gas through valve 14 is alternated with application of a vacuum through LPV valve 126, so that all of the residual purge gas is flushed from manifold 160 and pigtail 164. It will be noted that there are no dead-legs either in valve block 102, since the process gas flows through both of the valve chambers 206 of valve block 102, or in valve block 106, since the process gas also flows through both of the valve chambers 206 of valve block 106. More specifically, it is to be noted that when vacuum is applied to the manifold 100 through regulated pressure area 160, the process gas vented flows through the valve chamber 206 of closed LPI valve 124 as well as valve chamber 206 of open LPV valve 126. After the purge gas refill and alternating vacuum cycle is performed a predetermined number of times, the manifold is again filled with process gas, with LPV valve 126 being closed, and process gas can then be delivered to the tool location by opening LPI valve 124.

As will be appreciated from the disclosure of the above referenced U.S. Pat. No. 4,989,160, the above-described pre- and post purge and process gas refill operations, as well as at least some of the leak checking operations, may be automatically performed by an automatic gas cabinet, with some or all of the purge cycle parameters and pressure setpoints being subject to user programming.

PURGE GAS MANIFOLD

There will now be described, with reference to FIGS. 6, 7 and 8A–8D, a purge gas manifold 300 which may be installed in association with the gas cabinet manifold 100 of FIG. 3.

From FIG. 6, it will be seen that purge gas manifold 300 consists largely of a valve block 302 connected to a purge gas cylinder 312. The valve block 302 is, in schematic terms, equivalent to the valve block 102 shown in FIG. 4A, but preferably valve block 302 has its two valves 202' and 204' in a "V" configuration (see, for example, FIGS. 7 and 8B) rather than in an opposed orientation as in FIG. 4A.

Figure 7:
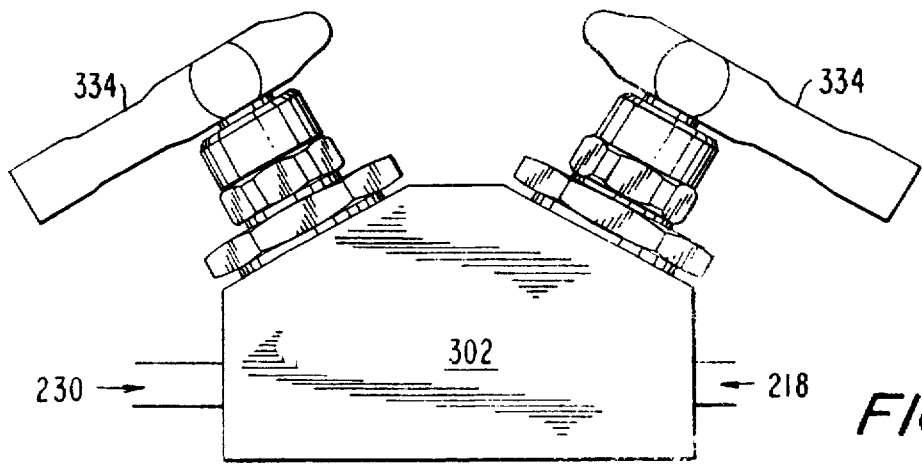
FIG. 7 is a front elevation view of a manually actuated dual valve assembly used in the purge gas manifold of FIG. 6.

Further, the diaphragm positioning mechanism of valve block 302 is preferably manually actuated, rather than pneumatic, and so includes handles 334 (FIG. 7). The additional safety feature of pneumatically operated valves is not required in purge gas manifold 300 since only inert, non-toxic purge gas is present therein. The "V" configuration of the valves is provided in block 302 in order to provide more convenient access to the handles 334 than would be present in an opposed arrangement of the valves.

The portions of the valves 202' and 204', corresponding to those of valves 202 and 204 shown in FIG. 4A, can be readily seen from FIGS. 8A–8D, which need not be described in detail. Elements of valve block 302 which correspond to those of block 102 have been given the same reference numerals. It will be understood that FIG. 8A is a plan view showing the valve chambers 206' of the valves 202' and 204', FIG. 8B is a cross-sectional view of valve block 302 taken at line B—B of FIG. 8A, FIG. 8C is a cross-sectional view of valve block 302 taken at line C—C of FIG. 8A, and FIG. 8D is a cross-sectional view of valve block 302 taken at line D—D of FIG. 8D. FIG. 8B shows the conduit 226 which connects the respective second inlet ports 210 of valve chambers 206'; FIG. 8C shows conduits 216 and 220 which respectively connect the selectively closable outlet ports 212 and 214 with ports 218 and 222; and FIG. 8D shows the conduit 224 which connects the respective first inlet ports 208 with port 230.

Although it would be possible to use manually actuated valve blocks like block 302 in place of the pneumatically actuated valve blocks 102, 104 and 106 shown in manifold 100 (FIG. 3), this is not preferred, since the safety and convenience provided by automatic operation through automatic control, as well as automatic shut-down in case of a malfunction, are desired for gas cabinet manifold 100.

Operation of purge gas manifold 300, and further details thereof, will now be briefly described with reference to FIG. 6. Purge gas cylinder 312 is connected to port 230 of valve block 302 via cylinder valve 314 and a pigtail 315, a filter 316 and a pressure transducer 318. Port 222 of valve block 302 is connected to the port 222 of valve block 104 (FIG. 3) by way of a pressure regulator 320, a pressure transducer 322 and a filter 324 (FIG. 6). Accordingly, the outlet of the valve 204' is connected to the outlet of HPP valve 118 (FIG. 3). Referring again to FIG. 6, port 218 of valve block 302 (and hence also outlet 212 of valve 202') is connected to an exhaust vent (not shown).

When purge gas is to be supplied to the gas cabinet manifold 100, valve 202' of valve block 302 is closed and cylinder valve 314 and valve 204 block' of valve 302 are opened. This allows purge gas to flow from cylinder 312 through cylinder block 302 and pressure transducer 320 to port 222 of valve block 104 (FIG. 3) and HPP valve 118.

More specifically, the purge gas flows from pigtail 315 into valve block 302 via its port 230 and then flows through both valve chambers 206' of the closed valve 202' and the open valve 204', exiting from valve block 302 via outlet port 214 of valve 204', as well as conduit 220 and port 222 of valve block 302. Accordingly, it will be seen that there are no dead-legs in the valve block 302 during delivery of purge gas to gas cabinet manifold 100.

When it is desired to change purge gas cylinder 312, there is no requirement for a pre-purge, since the purge gas is not toxic. Accordingly, valve 204' is simply closed and the purge gas cylinders 312 exchanged. A post-purge or flushing of the manifold 300 to remove contaminants can be accomplished by opening valve 202' and cylinder valve 314, so that purge gas flows through both of valve chambers 206' on its way out to the exhaust vent via port 218. It will be recognized that there are no dead-legs in purge gas manifold 300 during the flushing operation.

The above description of the invention is intended to be illustrative and not limiting. Various changes or modifications in the embodiments described may occur to those skilled in the art and these can be made without departing from the scope or spirit of the invention.

What is claimed is:

1. Valve apparatus for controlling the flow of gases, said apparatus comprising, in combination:
   at least one conduit in the form of a loop;
   said conduit having first, second and third ports spaced apart from one another;
   a pair of valve closure members, each being mounted adjacent one of said first and second ports and being movable to open and close the port to which it is adjacent; and
   an actuating device for selectively actuating said valve closure members to selectively open and close said first and second ports;
   in which said conduit extends from said third port past said first port and then past said second port and then back to said third port, and in which said valve closure members do not occlude said conduit.

2. Apparatus as in claim 1, in which said one conduit and said ports are formed in a single body member, and said closure members are mounted to said body member.

3. Apparatus as in claim 1 in which said closure members are flexible metal diaphragms.

4. Apparatus as in claim 1 in which said actuating device comprises means for pneumatically controlling the positions of said valve closure members.

5. Apparatus as in claim 1 in which said first and second ports are located substantially on opposite sides of said loop, and said third port is located between said first and second ports.

6. Apparatus as in claim 1 in which said loop is formed by a body member having first and second passageways therein, and third and fourth passageways joining said first and second passageways adjacent their ends, said first and second ports being located in said third and fourth passageways.

7. Apparatus as in claim 6 in which each of said third and fourth passageways is formed, on one side, by one of said valve closure members, and on the opposite side, by a side wall of said body member in which one of said first and second ports is formed.

8. Apparatus as in claim 7 and including a raised valve seat around each of said first and second ports so that when one of said diaphragms makes contact with said seat to close one of said first and second ports, a space is left for fluid to flow past said seat.

9. Apparatus as in claim 6 in which said third port is located in one of said first and second passageways.

* * * * *